(12) United States Patent
Trichy Rengarajan et al.

(10) Patent No.: US 11,121,004 B2
(45) Date of Patent: Sep. 14, 2021

(54) SEMICONDUCTOR MODULE AND METHOD FOR PRODUCING THE SAME

(71) Applicant: Infineon Technologies AG, Neubiberg (DE)

(72) Inventors: Gopalakrishnan Trichy Rengarajan, Lippstadt (DE); Sebastian Michalski, Lippstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/248,295

(22) Filed: Jan. 15, 2019

(65) Prior Publication Data
US 2019/0221449 A1   Jul. 18, 2019

(30) Foreign Application Priority Data
Jan. 16, 2018  (EP) .................................... 18151788

(51) Int. Cl.
| | | |
|---|---|---|
| *H01L 21/54* | (2006.01) | |
| *H01L 25/07* | (2006.01) | |
| *H01L 23/29* | (2006.01) | |
| *H01L 23/31* | (2006.01) | |
| *H01L 23/24* | (2006.01) | |
| *H01L 23/498* | (2006.01) | |

(52) U.S. Cl.
CPC ............. *H01L 21/54* (2013.01); *H01L 23/24* (2013.01); *H01L 23/295* (2013.01); *H01L 23/3135* (2013.01); *H01L 25/072* (2013.01); *H01L 23/49811* (2013.01)

(58) Field of Classification Search
None
See application file for complete search history.

(56) References Cited

U.S. PATENT DOCUMENTS

| | | | | |
|---|---|---|---|---|
| 5,349,240 A | * | 9/1994 | Narita .................... | H01L 23/24 257/787 |
| 5,430,330 A | | 7/1995 | Takahama et al. | |
| 2004/0140116 A1 | * | 7/2004 | Bayerer ................ | H01L 23/295 174/524 |
| 2009/0050957 A1 | * | 2/2009 | Nakao ................... | H01L 23/053 257/328 |
| 2011/0309527 A1 | * | 12/2011 | Okamoto ............... | H01L 24/49 257/782 |
| 2012/0280768 A1 | * | 11/2012 | Nakayama .......... | H03H 9/0576 333/193 |
| 2013/0056883 A1 | | 3/2013 | Furukawa | |

FOREIGN PATENT DOCUMENTS

| | | |
|---|---|---|
| DE | 102014104856 A1 | 10/2015 |
| JP | 61145851 A | 7/1986 |

* cited by examiner

*Primary Examiner* — Zandra V Smith
*Assistant Examiner* — Lawrence C Tynes, Jr.
(74) *Attorney, Agent, or Firm* — Murphy, Bilak & Homiller, PLLC

(57) ABSTRACT

A method for producing a power semiconductor module arrangement includes forming a pre-layer by depositing inorganic filler on a first surface within a housing, the inorganic filler being impermeable to corrosive gases. The method further includes filling casting material into the housing to fill spaces present in the inorganic filler of the pre-layer with the casting material, and hardening the casting material to form a first layer.

16 Claims, 3 Drawing Sheets

SEMICONDUCTOR MODULE AND METHOD FOR PRODUCING THE SAME

TECHNICAL FIELD

The instant disclosure relates to semiconductor module, and to a method for producing the same.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

Electrical lines or electrical connections are used to connect different semiconductor devices of the power semiconductor arrangement. Such electrical lines and electrical connections may include metal and/or semiconductor material. The housings of power semiconductor module arrangements are generally permeable to gases to a certain extent. Some gases such as sulfur containing gases, for example, may react with metallic components inside the housing. This leads to a chemical degradation of these components which may result in a failure of individual components and ultimately of the whole semiconductor arrangement.

There is a need for a power semiconductor module wherein the semiconductor components are protected against corrosion such that the overall lifetime of the power semiconductor module arrangement is increased.

SUMMARY

A method for producing a power semiconductor module arrangement includes forming a pre-layer by depositing inorganic filler on a first surface within a housing, wherein the inorganic filler is impermeable for corrosive gases. The method further includes filling casting material into the housing, thereby filling any spaces present in the inorganic filler of the pre-layer with the casting material, and hardening the casting material, thereby forming a first layer.

A power semiconductor module arrangement includes a semiconductor substrate arranged within a housing, at least one semiconductor body arranged on a top surface of the semiconductor substrate, and a first layer arranged on a first surface within the housing, wherein the first layer comprises an inorganic filler which is impermeable for corrosive gases, and a casting material that fills any spaces present in the inorganic filler.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
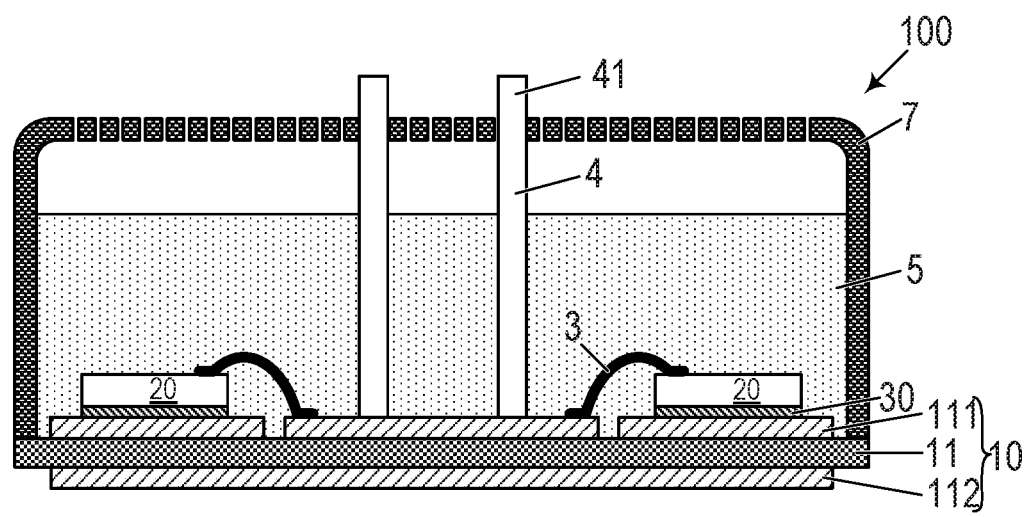
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a semiconductor substrate 10. The semiconductor substrate 10 includes a dielectric insulation layer 11, a (structured) first metallization layer 111 attached to the dielectric insulation layer 11, and a second (structured) metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminium; an aluminium alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminium oxide; aluminium nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminium Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BrN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 7. In the example illustrated in FIG. 1, the semiconductor substrate 10 forms a ground surface of the housing 7, while the housing 7 itself solely comprises sidewalls and a cover. This is, however, only an example. It is also possible that the housing 7 further comprises a ground surface and the semiconductor substrate 10 be arranged inside the housing 7. According to another example, the semiconductor substrate 10 may be mounted on a base plate (not illustrated). In some power semiconductor module arrangements 100, more than one semiconductor substrate 10 is arranged on a single base plate. The base plate may form a ground surface of the housing 7, for example.

One or more semiconductor bodies 20 may be arranged on the semiconductor substrate 10. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using, e.g., bonding wires 3. Electrical connections 3 may also include connection plates or conductor rails, for example, to name just a few examples. The one or more semiconductor bodies 20 may be electrically and mechanically connected to the semiconductor substrate 10 by an electrically conductive connection layer 30. Such an electrically conductive connection layer may be a solder layer, a layer of an electrically conductive adhesive, or a layer of a sintered metal powder, e.g., a sintered silver powder, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end, while a second end 41 of the terminal elements 4 protrudes out of the housing 7. The terminal elements 4 may be electrically contacted from the outside at their second end 41. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Terminal elements 4 could also protrude through the sidewalls of the housing 7 instead of through the cover. Any other suitable implementation is possible.

The semiconductor bodies 20 each may include a chip pad metallization, e.g., a source, drain, anode, cathode or gate metallization. A chip pad metallization generally provides a contact surface for electrically connecting the semiconductor body 20. The chip pad metallization may electrically contact a connection layer 30, a terminal element 4, or an electrical connection 3, for example. A chip pad metallization may consist of or include a metal such as aluminum, copper, gold or silver, for example. The electrical connections 3 and the terminal elements 4 may also consist of or include a metal such as copper, aluminum, gold, or silver, for example.

The above mentioned components, as well as other components of the power semiconductor module arrangement 100 inside the housing 7, may corrode when they come into contact with corrosive gases. Corrosive gases may include, e.g., sulfur or sulfur-containing compounds such as hydrogen sulfide $H_2S$, for example. Corrosive gases in the surrounding area of the power semiconductor module arrangement 100 may penetrate into the inside of the housing 7. The housings 7 that are used for power semiconductor module arrangements 100 are usually not fully protected against intruding gases. Further, corrosive gases may enter the housing 7 when the housing 7 is opened or before the housing 7 is closed, for example. Inside the housing 7, the corrosive gases may form acids or solutions, for example, in combination with moisture that may be present inside the housing 7. The corrosive gases or the resulting solutions may cause a corrosion of some or all of the components. During the corrosion process, the metallic constituents of the components may be oxidized to their respective sulfides. The sulfide formation may alter the electrical properties of the components or may result in the formation of new conductive connections and in short circuits within the power semiconductor module arrangement 100.

Further, when exposed to corrosive gases and further under the influence of electric fields and possibly moisture, dendritic structures may form from mobile metal ions (e.g., Cu, Ag, etc.) of the metal comprising components and structures of the power semiconductor module arrangement 100 and anions (e.g., $S^{2-}$) that are present in the corrosive gas. A dendrite is a characteristic tree-like structure of crystals. Dendritic growth in metal layers has large consequences with regard to material properties and is generally unwanted Examples for corrosive gases are hydrogen sulfide ($H_2S$), carbonyl sulfide (OCS), or gaseous sulfur ($S_8$). In some applications, the power semiconductor module arrangement may be exposed to corrosive gases such as $Cl^-$, $SO_x$, or $NO_x$, for example. Generally, it is also possible that sulfur gets to the inside of the housing 7 as constituent of a solid material or liquid.

Components and structures including one or more metals such as copper (e.g., first metallization layer 111, electrical connection 3, terminal element 4, connection layer 30, chip pad metallization), silver (e.g., first metallization layer 111, electrical connection 3, terminal element 4, connection layer 30, chip pad metallization), or lead (e.g. connection layer 30 including leaded solder), may be particularly sensitive to corrosion. Other metals such as aluminum, for example, may have a thin oxide layer covering their surface area, which may provide at least a certain amount of protection against corrosive gases.

Conventional power semiconductor module arrangements 100 generally further include a casting compound 5. The casting compound 5 may consist of or include a silicone gel or may be a rigid molding compound, for example. The casting compound 5 may at least partly fill the interior of the housing 7, thereby covering the components and electrical connections that are arranged on the semiconductor substrate 10. The terminal elements 4 may be partly embedded in the casting compound 5. At least their second ends 41, however, are not covered by the casting compound 5 and protrude from the casting compound 5 through the housing 7 to the outside of the housing 7. The casting compound 5 is configured to protect the components and electrical connections inside the power semiconductor module 100, in particular inside the housing 7, from certain environmental conditions and mechanical damage. The casting compound 5 further provides for an electrical isolation of the components inside the housing 7. However, corrosive gases are usually able to penetrate through the casting compound 5. The casting compound 5, therefore, is usually not able to protect the components and electrical connections from corrosive gases.

The casting compound 5 may form a protective layer in a vertical direction of the semiconductor substrate 10. The vertical direction is a direction that is essentially perpendicular to a top surface of the semiconductor substrate 10. The top surface of the semiconductor substrate 10 is a surface on which semiconductor bodies 20 are or may be mounted. The first protective layer 5 at least partly covers any components that are arranged on the top surface of the semiconductor substrate 10 as well as any exposed surfaces of the semiconductor substrate 10.

To better protect the metallic components of the power semiconductor module arrangement 100 against corrosive gases, the casting compound 5 may further include a reactant 61, for example. This is exemplarily illustrated in FIG. 2. The reactant 61 may be configured to chemically react with the corrosive gases, or, in particular, with the sulfur or sulfur-containing compounds of the corrosive gases. Corrosive gas may also be trapped, adsorbed or absorbed by the reactant 61. By chemically reacting with the corrosive gas, the reactant 61 prevents the harmful substances from reaching the (metal) components inside the housing 7 and thereby protects the components against corrosion. The reactant 61 may be, for example, a powder of a second material which is distributed throughout the first material of the casting compound 5. The second material may include any materials, e.g., metallic materials, which react with the corrosive gases and which may, e.g., form a metal sulfide when exposed to corrosive gases. The reactant 61 may be essentially evenly distributed throughout the casting compound 5. The first material of the casting compound 5 may consist of or include a non-reactive polymer such as a silicone gel or silicone rubber, for example. Other casting materials are also possible such as epoxy resin, for example.

Figure 2:
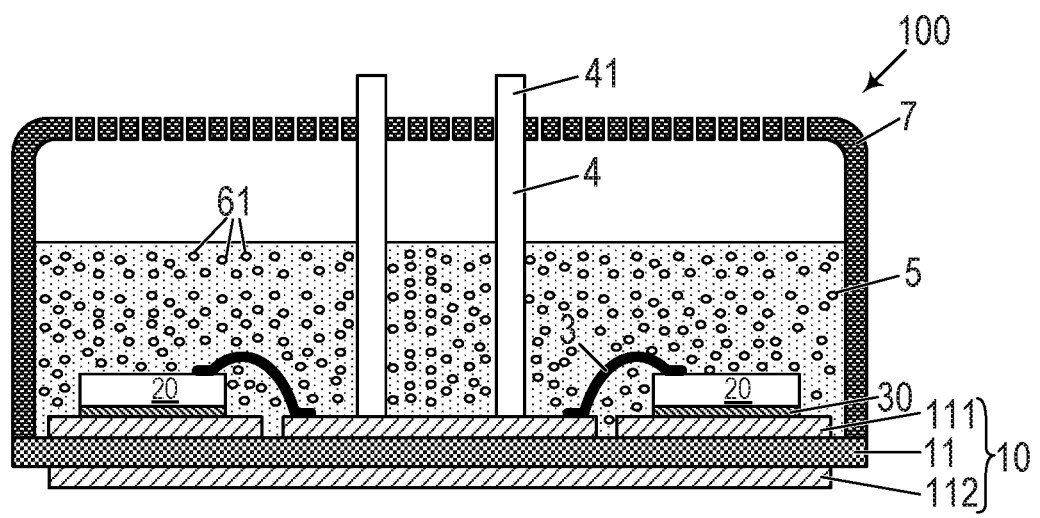
FIG. 2 is a cross-sectional view of another power semiconductor module arrangement.

However, such casting compounds 5 including a reactant 61 may also be permeable for corrosive gases to a certain extend. This means that power semiconductor module arrangements 100 as illustrated in FIGS. 1 and 2 may not be sufficiently protected against corrosive gases.

Figure 5:
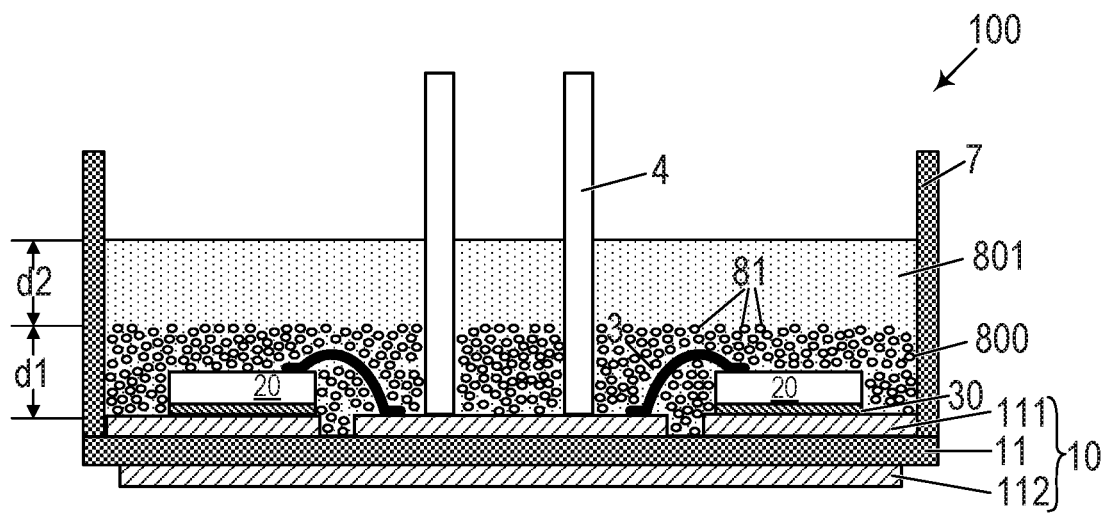

A power semiconductor module arrangement 100, therefore, may include a first layer 800 and a second layer 801, as is exemplarily illustrated in FIG. 5. The first layer 800 may be arranged adjacent to the semiconductor substrate 10, and the second layer 801 may be arranged adjacent to the first layer 800 such that the first layer 800 is arranged between the semiconductor substrate 10 and the second layer 801. The first layer 800 may comprise a casting material such as a non-reactive, soft or hard cross-linking polymer, for example. The non-reactive polymer may include a silicone gel or silicone rubber, for example. Other casting materials are also possible such as epoxy resin, for example. The first layer 800 further comprises a filler 81 such as an inorganic filler, for example. Inorganic fillers may include non-melting inorganic materials such as silica, fused silica, crystalline silica, precipitated silica, alumina, beryllium, boron nitride, aluminum nitride, silicon nitride, silicon carbide, boron carbide, titanium carbide, magnesium oxide, zinc oxide, or glass fiber, for example. The filler 81 may be provided in the form of particles with a diameter of between about 1 and 50 μm, or between about 4 and 20 μm, for example. In the mixture including the casting material and the filler 81, the amount of filler 81 may be between about 40 and 90 vol %, or between 60 and 80 vol %, for example. Generally speaking, the first layer 800 may include a comparably high amount of filler 81.

If the inorganic filler 81 includes an electrically conductive material such as a metallic material, for example, the concentration of the inorganic fillers 81 in the first layer 800 may be such that the first layer 800 as a whole is still electrically insulating.

The first layer 800 may have a first thickness d1 in a first vertical direction. The first vertical direction is a direction that is essentially perpendicular to a top surface of the semiconductor substrate 10. The top surface of the semiconductor substrate 10 is a surface to which semiconductor bodies 20 are or may be mounted. The first layer 800 at least partly covers any components that are arranged on the top surface of the semiconductor substrate 10 as well as any exposed surfaces of the semiconductor substrate 10. The first thickness d1 may be between 1 mm and 10 mm, or between 2 mm and 6 mm, for example.

The second layer 801 is arranged on top of the first layer 800. On top of the first layer 800 in this context means that the second layer 801 is arranged adjacent to the first layer 800 in the first vertical direction such that the first layer 800 is arranged between the second layer 801 and the semiconductor substrate 10. The second layer 801 may include a casting material such as a non-reactive, soft or hard cross-linking polymer, for example. The non-reactive polymer may include a silicone gel or silicone rubber, for example. Other casting materials are also possible such as epoxy resin, for example. The material of the second layer 801 may be the same as the first material of the first layer 800. The second layer 801 may have a second thickness d2 in the first vertical direction. The second thickness d2 may be the same or may be greater than the first thickness d1. For example, the second thickness d2 may be between 1 mm and 10 mm, or between 2 mm and 6 mm.

As is illustrated in the example of FIG. 5, only a bottom of the housing 7 of the power semiconductor module arrangement 100 may be filled with the first layer 800 including both the first material and the filler 81. The height d1 of the first layer 800 is considerably less than the height of the casting compound in the arrangement illustrated in FIG. 2, where a major part of the housing 7 is filled with the casting compound 5 including the reactant 61. The comparably great thickness of the single layer 5 of the power semiconductor module arrangement of FIG. 2 may result in a deflection of the power semiconductor module arrangement 100, in particular, in a deflection of the semiconductor substrate 10 and/or a base plate (if applicable). The comparably thin first layer 800 of the power semiconductor module arrangement of FIG. 5 generally causes less or even no deflection of the power semiconductor module arrangement 100.

Figure 3:
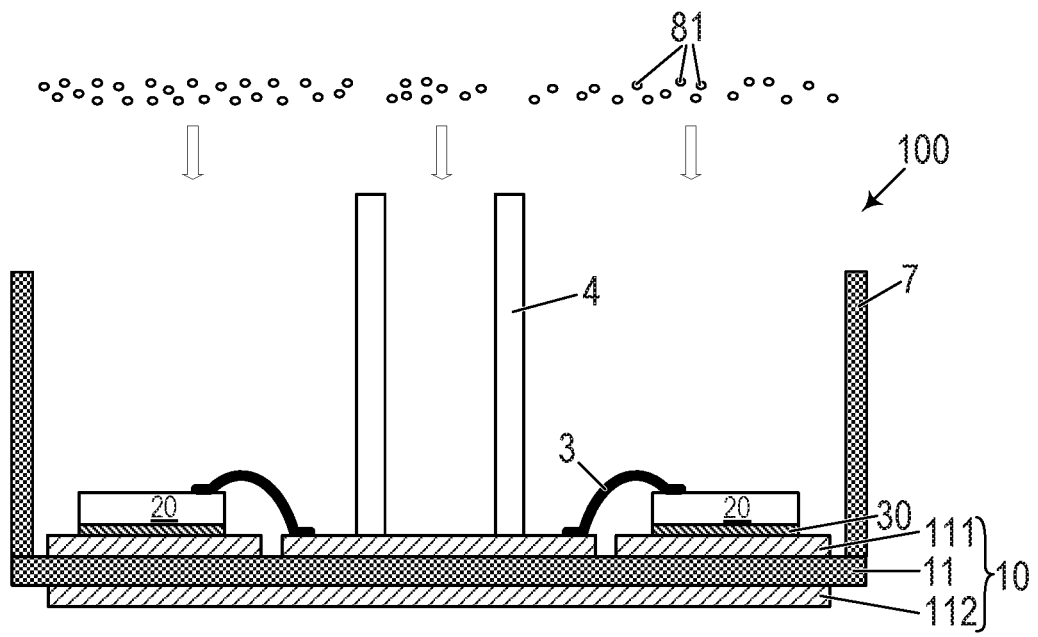
FIGS. 3 to 5 illustrate steps of a method for producing a power semiconductor module arrangement.
Figure 4:
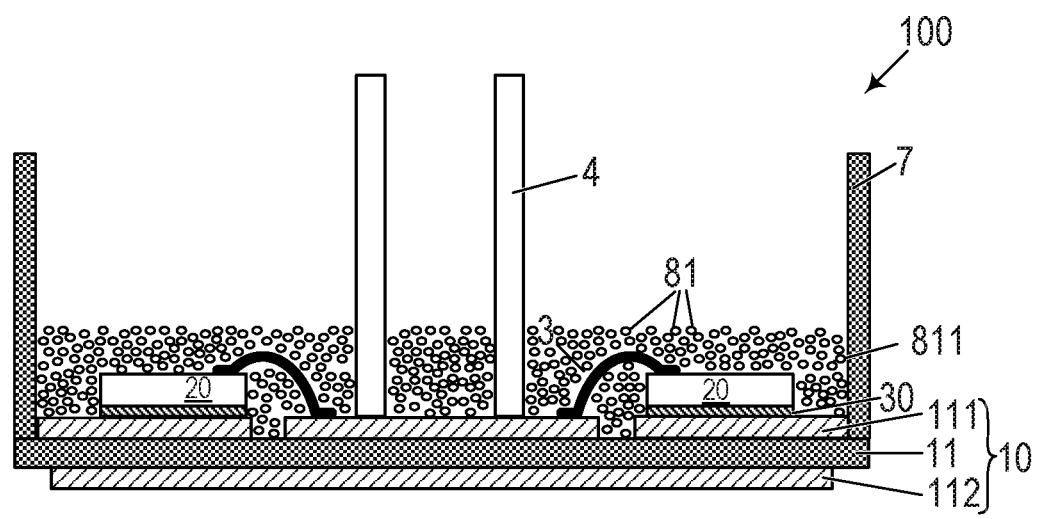

FIG. 5 illustrates one example of a power semiconductor module arrangement 100 after forming the first layer 800 and the second layer 801. A method for producing the power semiconductor module arrangement of FIG. 5 is now explained by means of FIGS. 3 to 5. FIG. 3 illustrates a power semiconductor module arrangement 100 before forming the first layer 800 and the second layer 801. The power semiconductor module arrangement 100 comprises a semiconductor substrate 10. The semiconductor substrate 10 may correspond to the semiconductor substrate 10 as has been described with respect to FIGS. 1 and 2 above. As has been described above, one or more semiconductor bodies 20 may be arranged on the semiconductor substrate 10. The power semiconductor module arrangement 100 may further comprise terminal elements 4, as has already been described above. The housing 7 of the power semiconductor module arrangement 100 essentially corresponds to the housing 7 as has been described with respect to FIGS. 1 and 2 above. A cover, however, may be added to the housing 7 at a later stage after forming the first and second layers 800, 801. It is also possible that the housing 7 of the arrangement as illustrated in FIG. 3 further comprises a bottom. Instead, the semiconductor substrate 10 may also be arranged on a base plate (not illustrated). As is schematically illustrated in FIG. 3, the inorganic filler 81 may be deposited on the semiconductor substrate 10 and any components arranged on the semiconductor substrate 10, such as the semiconductor bodies 20, for example. The deposited inorganic filler 81 forms a pre-layer 811 on the semiconductor substrate 10, as is schematically illustrated in FIG. 4.

The inorganic filler 81 may include particles that are stacked on top of each other. The particles may have a generally rounded or oval shape, for example. The pre-layer 811, therefore, is a porous layer which includes spaces or gaps between the different particles of the inorganic filler 81. In a following step, a compound material may be filled into the housing 7. The compound material (first material) may fill the spaces and gaps between the particles of the inorganic filler 81. The second layer 801 may be formed in the same step by filling more casting material into the housing 7 than is needed for filling the spaces and gaps between the particles of the inorganic filler 81. Once the spaces and gaps are filled, any surplus compound material will fill the space above the first layer 800, thereby forming the second layer 801.

A curing step may follow (not illustrated). When curing the casting material, the casting material cross-links with the inorganic filler 81. This significantly reduces the mobility of the inorganic filler 81. By essentially filling all remaining spaces and gaps between the particles of the inorganic filler 81, as well as by cross-linking the casting material and the inorganic fillers, it becomes difficult or even impossible for any gases to diffuse through the first layer 800.

Figure 6:
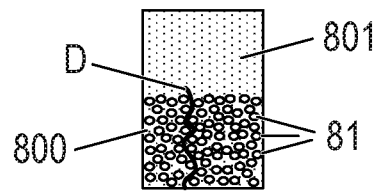
FIG. 6 exemplarily illustrates a diffusion path for gases in a power semiconductor module arrangement.

This is exemplarily illustrated in FIG. 6. FIG. 6 schematically illustrates a section of the first and second layers 800, 801. The particles of the inorganic filler 81 are stacked onto each other in a random manner. Therefore, gases cannot diffuse through the first layer 800 in a straight line. Generally, gases cannot penetrate through the inorganic filler 81, but only through the casting material surrounding the filler 81. Gases, therefore, have to diffuse around the inorganic fillers 81, which results in a comparatively long diffusion path D. This makes it more difficult for gases to diffuse through the first layer 800. Generally, as the amount of inorganic filler 81 is comparatively high in the first layer 800, there is very little space for gases to diffuse through the first layer 800. This makes it almost impossible for corrosive gases to diffuse through the first layer 800.

Figure 7:
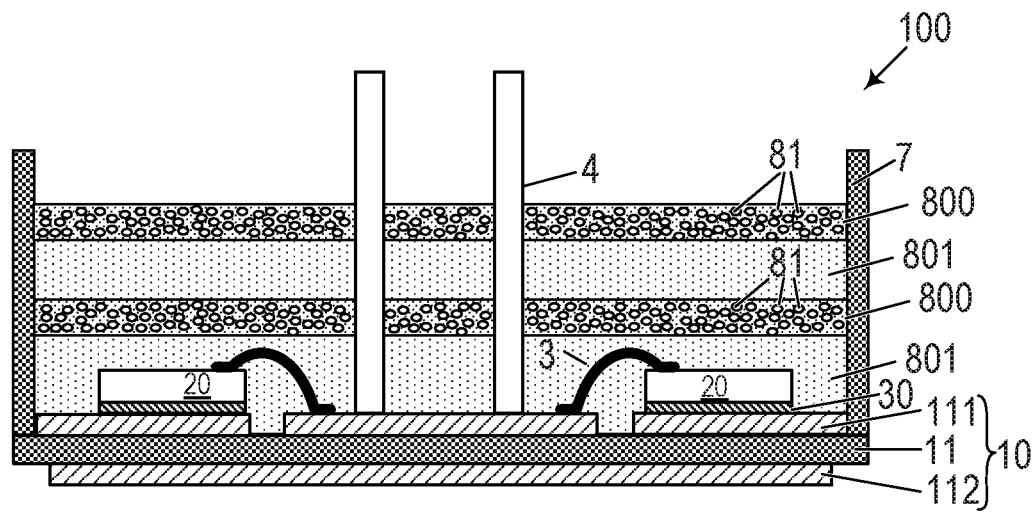
FIG. 7 schematically illustrates a cross-sectional view of another exemplary semiconductor module arrangement.

The power semiconductor module arrangement 100 of FIG. 5, however, is only an example. The first layer 800 does not necessarily have to be arranged adjacent to the semiconductor substrate 10. As is exemplarily illustrated in FIG. 7, the second layer 801 may be arranged adjacent to the semiconductor substrate 10. The first layer 800 may be arranged adjacent to the second layer 801 such that the second layer 801 is arranged between the first layer 800 and the semiconductor substrate 10. As is illustrated in FIG. 7, the power semiconductor module arrangement 100 may even comprise more than one first layer 800 and more than one second layer 801. For example, a further second layer 801 may be arranged adjacent to the first layer 800 such that the first layer 800 is arranged between two second layers 801. An even further first layer 800 may be arranged on top of the other first and second layers 800, 801. In this way, the power semiconductor module arrangement 100 comprises alternating first and second layers 800, 801. It is also possible, that the arrangement of FIG. 5 comprises further layers stacked on top of the second layer 801.

If the power semiconductor module arrangement 100 comprises a second layer 801 that is arranged adjacent to the semiconductor substrate 10, this requires further process steps. For example, first a second layer 801 may be formed on the semiconductor substrate 10. The second layer 801 may be cured and hardened. Then, an inorganic filler 81 may be deposited on the second layer 801. The spaces and gaps between the particles of the inorganic filler 81 may then be filled with casting material. Optionally, a further second layer 801 may be formed at the same time while filling the spaces and gaps between the inorganic fillers 81, as has been described with respect to FIG. 5 above. The steps may then be repeated to form further first and second layers 800, 801.

Generally speaking, the power semiconductor module arrangement 100 includes at least one first layer 800. This first layer 800 may be formed in three steps, for example. In a first step, a pre-layer 811 may be formed by depositing inorganic filler 81 on a first surface within a housing 7, wherein the inorganic filler 81 is impermeable for corrosive gases. In a second step, casting material is filled into the housing 7, thereby filling any spaces present in the inorganic filler 81 of the pre-layer 811 with the casting material. This is followed by a hardening step during which the casting material is hardened, thereby forming the first layer 800.

The first surface may be a top surface of a semiconductor substrate 10 that is arranged in the housing 7. The first layer 800 in this case is arranged adjacent to the semiconductor substrate 10 and any components mounted on the semiconductor substrate 10. In this case, the method may further comprise forming a second layer 801 on the first layer 800 such that the first layer 800 is arranged between the second layer 801 and the semiconductor substrate 10. The second layer 801 may comprise a casting material but no filler. The first layer 800, therefore, is formed before the second layer 801.

According to an alternative embodiment, the first surface may be a top surface of a second layer 801 covering a semiconductor substrate 10 arranged in the housing 7. In this case, the second layer 801 is formed before the first layer and, after forming the first layer 800, the second layer 801 is arranged between the first layer 800 and the semiconductor substrate 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a power semiconductor module arrangement, the method comprising:
    forming a pre-layer by depositing inorganic filler on a first surface within a housing, wherein the inorganic filler is impermeable to corrosive gases;
    filling casting material into the housing to fill spaces present in the inorganic filler of the pre-layer with the casting material; and
    hardening the casting material to form a first layer,
    wherein the inorganic filler comprises particles with a diameter between 4 and 20 μm.

2. The method of claim 1, wherein the pre-layer is a porous layer.

3. The method of claim 1, wherein the casting material comprises a non-reactive soft polymer, a non-reactive hard polymer, and/or an epoxy resin.

4. The method of claim 3, wherein the non-reactive soft or hard polymer comprises silicone gel or silicone rubber.

5. The method of claim 1, wherein the inorganic filler comprises silica, fused silica, crystalline silica, precipitated silica, alumina, beryllium, boron nitride, aluminum nitride, silicon nitride, silicon carbide, boron carbide, titanium carbide, magnesium oxide, zinc oxide, and/or glass fiber.

6. The method of claim 1, wherein in the first layer including the casting material and the filler, the amount of filler is between 40 and 90 vol %.

7. The method of claim 6, wherein in the first layer including the casting material and the filler, the amount of filler is between 60 and 80 vol %.

8. The method of claim 1, wherein the first surface is a top surface of a substrate that is arranged in the housing.

9. The method of claim 8, further comprising:
    forming a second layer on the first layer such that the first layer is arranged between the second layer and the substrate,
    wherein the second layer comprises a casting material.

10. The method of claim 1, wherein the first surface is a top surface of a second layer covering a substrate arranged in the housing, and wherein the second layer is arranged between the first layer and the substrate.

11. The method of claim 10, wherein the first layer has a first thickness in a direction perpendicular to the first surface, wherein the second layer has a second thickness in the direction perpendicular to the first surface, and wherein the second thickness is the same as or greater than the first thickness.

12. The method of claim 10, further comprising:
    forming at least one further first layer; and/or
    forming at least one further second layer.

13. A method for producing a power semiconductor module arrangement, the method comprising:
    forming a second layer on a substrate within a housing;
    depositing inorganic filler on the second layer, wherein the inorganic filler is impermeable to corrosive gases;
    filling casting material into the housing to fill spaces between particles of the inorganic filler with the casting material;
    hardening the casting material to form a first layer on the second layer;
    forming a further second layer on the first layer;
    depositing further inorganic filler on the further second layer, wherein the further inorganic filler is impermeable to corrosive gases;
    filling further casting material into the housing to fill spaces between particles of the further inorganic filler with the further casting material; and
    hardening the further casting material to form a further first layer on the further second layer.

14. The method of claim 13, wherein the first layer has a first thickness in a direction perpendicular to the substrate, wherein the second layer has a second thickness in the direction perpendicular to the substrate, and wherein the second thickness is the same as or greater than the first thickness.

15. The method of claim 13, further comprising:
    curing and hardening the second layer before depositing the inorganic filler on the second layer.

16. The method of claim 13, wherein the further second layer is formed at the same time while filling the spaces between the particles of the inorganic filler with the casting material.

* * * * *